(12) United States Patent
Zhu et al.

(10) Patent No.: US 11,462,570 B2
(45) Date of Patent: Oct. 4, 2022

(54) DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Jing Zhu, Shenzhen (CN); Tianhong Wang, Shenzhen (CN)

( * ) Notice: Subject to any disclaimer, the term of this patent is extended or adjusted under 35 U.S.C. 154(b) by 286 days.

(21) Appl. No.: 16/618,812

(22) PCT Filed: Sep. 29, 2019

(86) PCT No.: PCT/CN2019/109091
§ 371 (c)(1),
(2) Date: Dec. 3, 2019

(87) PCT Pub. No.: WO2020/224172
PCT Pub. Date: Nov. 12, 2020

(65) Prior Publication Data
US 2021/0351204 A1 Nov. 11, 2021

(30) Foreign Application Priority Data
May 5, 2019 (CN) .......................... 201910368262.6

(51) Int. Cl.
*H01L 27/12* (2006.01)
*H01L 23/00* (2006.01)

(52) U.S. Cl.
CPC ............ *H01L 27/124* (2013.01); *H01L 24/29* (2013.01)

(58) Field of Classification Search
CPC ... H01L 27/124; H01L 24/29; H01L 27/1244;
G02F 1/13338; G02F 1/1339; G02F 1/1345; G02F 1/13306; G02F 1/1337; G02F 1/1368; G02F 1/1341; G02F 1/13415; G02F 1/13439; G02F 1/136286; G02F 1/134309; G02F 1/1343; G02F 1/13394; G02F 1/133512
USPC ... 349/106, 123, 5, 139, 158, 149, 153, 129, 349/40, 187, 113; 257/E21.414, E27.12; 438/34

See application file for complete search history.

(56) References Cited

U.S. PATENT DOCUMENTS

| | | | | |
|---|---|---|---|---|
| 2003/0164907 A1* | 9/2003 | Date | .................... | G02F 1/1341 349/113 |
| 2005/0184654 A1* | 8/2005 | Kobayashi | .......... | H01L 27/3293 313/504 |
| 2006/0119778 A1* | 6/2006 | Oda | .................... | G02F 1/13452 349/149 |

(Continued)

FOREIGN PATENT DOCUMENTS

| CN | 104335111 A | 2/2015 |
|---|---|---|
| CN | 105093759 A | 11/2015 |

(Continued)

*Primary Examiner* — Mouloucoulaye Inoussa

(57) ABSTRACT

The present application provides a display panel, comprising a display area and a border area disposed at a periphery of the display area, the border area comprising: an array substrate comprising a first substrate and a gate driver on array (GOA) circuit disposed on the first substrate; a color filter substrate comprising a second substrate and a signal trace disposed on the second substrate; wherein the GOA circuit is overlapped with the signal trace. The present application also relates to a display device.

8 Claims, 2 Drawing Sheets

(56) References Cited

U.S. PATENT DOCUMENTS

| | | | | |
|---|---|---|---|---|
| 2006/0221296 A1* | 10/2006 | Fujita | | G02F 1/1337 349/187 |
| 2006/0262267 A1* | 11/2006 | Sekiguchi | | G02F 1/133734 349/187 |
| 2006/0290871 A1* | 12/2006 | Harada | | G02F 1/1337 349/153 |
| 2007/0023907 A1* | 2/2007 | Fork | | H01L 21/6835 257/738 |
| 2007/0296899 A1* | 12/2007 | Murade | | G02F 1/1345 349/139 |
| 2010/0316790 A1* | 12/2010 | Li | | G02F 1/1339 427/68 |
| 2011/0085119 A1* | 4/2011 | Shiau | | G02F 1/13392 349/129 |
| 2011/0194062 A1* | 8/2011 | Lee | | G02F 1/1339 349/149 |
| 2011/0317121 A1* | 12/2011 | Lin | | G02F 1/1345 349/158 |
| 2012/0113333 A1* | 5/2012 | Oba | | G02F 1/13458 349/5 |
| 2012/0113364 A1* | 5/2012 | Hsu | | G02F 1/1339 349/106 |
| 2014/0347612 A1* | 11/2014 | Park | | G02F 1/133516 349/106 |
| 2015/0131041 A1* | 5/2015 | Moriwaki | | G02F 1/133345 349/106 |
| 2017/0017109 A1* | 1/2017 | Park | | G02F 1/13394 |
| 2017/0160574 A1* | 6/2017 | Yamaguchi | | G02F 1/13306 |
| 2017/0285430 A1* | 10/2017 | Hu | | G02F 1/1343 |
| 2018/0130861 A1* | 5/2018 | Eguchi | | G06F 3/047 |
| 2018/0188574 A1 | 7/2018 | Hu et al. | | |
| 2019/0113794 A1 | 4/2019 | Song | | |

FOREIGN PATENT DOCUMENTS

| | | |
|---|---|---|
| CN | 107632472 A | 1/2018 |
| CN | 108254979 A | 7/2018 |
| CN | 207650520 U | 7/2018 |

* cited by examiner

DISPLAY PANEL AND DISPLAY DEVICE

CROSS REFERENCE TO RELATED APPLICATION

This application claims the priority of International Application No. PCT/CN2019/109091, filed on 2019 Sep. 29, which claims priority to Chinese Application No. 201910368262.6, filed on 2019 May 5. The entire disclosures of each of the above applications are incorporated herein by reference.

BACKGROUND OF INVENTION

Field of Invention

The present application relates to the display technology, and particularly, to a display panel and a display device.

Description of Prior Art

FIG. 1 is a schematic diagram of a display panel of the prior art. The display panel comprises a display area and a border area disposed at a periphery of the display area. The border area consists of three parts: a gate driver on array (GOA) circuit, a GOA signal trace, and a common electrode. The GOA signal trace is applied to large-size and high-resolution products, and a capacitive load is heavier. Therefore, a design of the GOA signal trace is required to be wider, and a required frame is larger.

A box side of the display panel is consisted of a conductive adhesive and a substrate. Since the conductive adhesive needs to be cured by ultraviolet irradiation, an opening ratio of the trace on an array substrate side should meet certain requirements before the conductive adhesive can be cured well.

Due to the above requirements, when the conductive adhesive does not overlap with the GOA signal trace, the GOA signal trace can be solidly designed. If the conductive adhesive overlaps with the GOA signal trace, the GOA signal trace will be slit. In order to maintain an effective metal line width, both sides require a large width of the bezel.

SUMMARY OF INVENTION

The embodiment of the present application provides a display panel and a display device to solve the technical problem that the existing display panel has a large requirement on the width of the frame.

The embodiment of the present application provides a display panel, comprising a display area and a border area disposed at a periphery of the display area, the border area comprising: an array substrate comprising a first substrate and a gate driver on array (GOA) circuit disposed on the first substrate; and a color filter substrate comprising a second substrate and a signal trace disposed on the second substrate; wherein the GOA circuit is overlapped with the signal trace; wherein the color filter substrate comprises a first common electrode trace, and the first common electrode trace is disposed on a side of the signal trace away from the display area; wherein in the border area, the array substrate comprises a second common electrode trace, and the second common electrode trace is disposed on a side of the GOA circuit away from the display area; wherein the first common electrode trace is overlapped with the second common electrode trace; and wherein the first common electrode trace and the signal trace is solid metal traces.

In the display panel of the present application, the border area further comprises a conductive paste fixedly disposed between the array substrate and the color filter substrate, the GOA circuit and the signal trace are electrically connected through the conductive paste, and the first common electrode trace and the second common electrode trace are electrically connected through the conductive paste.

In the display panel of the present application, the array substrate comprises a first metal layer, a first insulating layer, an active layer, a second metal layer, a second insulating layer, a first planarization layer, and a first transparent conductive layer, which are sequentially disposed on the first substrate; wherein the color filter substrate comprises a third metal layer, a third insulating layer, a second planarization layer, and a second transparent conductive layer, which are sequentially disposed on the second substrate; and wherein the first transparent conductive layer and the second transparent conductive layer are electrically connected through the conductive paste.

In the display panel of the present application, the GOA circuit comprises a plurality of thin film transistors, gate electrodes of the thin film transistors are disposed in the first metal layer, source electrodes and drain electrodes of the thin film transistors are disposed in the second metal layer, channel regions of the thin film transistors are disposed in the active layer, and the source electrodes and the drain electrodes are electrically connected to the first transparent conductive layer through first vias; and wherein the signal trace is disposed in the third metal layer, and the signal trace is electrically connected to the second transparent conductive layer through a second via.

In the display panel of the present application, the second common electrode trace is disposed in the first metal layer, the second common electrode trace is electrically connected to the second metal layer through a third via, and the second metal layer is electrically connected to the first transparent conductive layer through a fourth via; and wherein the first common electrode trace is disposed in the third metal layer, and the first common electrode trace is electrically connected to the second transparent conductive layer through a fifth via.

In the display panel of the present application, the conductive paste comprises a colloid and an electrical conductor disposed in the colloid, the GOA circuit and the signal trace are electrically connected through the electrical conductor, and the first common electrode trace and the second common electrode trace are electrically connected through the electrical conductor The application also relates to a display panel, comprising a display area and a border area disposed at a periphery of the display area, the border area comprising: an array substrate comprising a first substrate and a gate driver on array (GOA) circuit disposed on the first substrate; and a color filter substrate comprising a second substrate and a signal trace disposed on the second substrate; wherein the GOA circuit is overlapped with the signal trace.

In the display panel of the present application, in the border area, the color filter substrate comprises a first common electrode trace, and the first common electrode trace is disposed on a side of the signal trace away from the display area.

In the display panel of the present application, in the border area, the array substrate comprises a second common electrode trace, and the second common electrode trace is disposed on a side of the GOA circuit away from the display area; and wherein the first common electrode trace is overlapped with the second common electrode trace.

In the display panel of the present application, the border area further comprises a conductive paste fixedly disposed between the array substrate and the color filter substrate, the GOA circuit and the signal trace are electrically connected through the conductive paste, and the first common electrode trace and the second common electrode trace are electrically connected through the conductive paste.

In the display panel of the present application, the array substrate comprises a first metal layer, a first insulating layer, an active layer, a second metal layer, a second insulating layer, a first planarization layer, and a first transparent conductive layer, which are sequentially disposed on the first substrate; wherein the color filter substrate comprises a third metal layer, a third insulating layer, a second planarization layer, and a second transparent conductive layer, which are sequentially disposed on the second substrate; and wherein the first transparent conductive layer and the second transparent conductive layer are electrically connected through the conductive paste.

In the display panel of the present application, the GOA circuit comprises a plurality of thin film transistors, gate electrodes of the thin film transistors are disposed in the first metal layer, source electrodes and drain electrodes of the thin film transistors are disposed in the second metal layer, channel regions of the thin film transistors are disposed in the active layer, and the source electrodes and the drain electrodes are electrically connected to the first transparent conductive layer through first vias; and wherein the signal trace is disposed in the third metal layer, and the signal trace is electrically connected to the second transparent conductive layer through a second via.

In the display panel of the present application, the second common electrode trace is disposed in the first metal layer, and the second common electrode trace is electrically connected to the second metal layer through a third via, and the second metal layer is electrically connected to the first transparent conductive layer through a fourth via; and wherein the first common electrode trace is disposed in the third metal layer, and the first common electrode trace is electrically connected to the second transparent conductive layer through a fifth via.

In the display panel of the present application, the first common electrode trace and the signal trace are solid metal traces.

In the display panel of the present application, the conductive paste comprises a colloid and an electrical conductor disposed in the colloid, the GOA circuit and the signal trace are electrically connected through the electrical conductor, and the first common electrode trace and the second common electrode trace are electrically connected through the electrical conductor.

The application also relates to a display device comprising a display panel, and the display panel comprising a display area and a border area disposed at a periphery of the display area, the border area comprising: an array substrate comprising a first substrate and a gate driver on array (GOA) circuit disposed on the first substrate; and a color filter substrate comprising a second substrate and a signal trace disposed on the second substrate; wherein the GOA circuit is overlapped with the signal trace.

In the display device of the present application, in the border area, the color filter substrate comprises a first common electrode trace, and the first common electrode trace is disposed on a side of the signal trace away from the display area.

In the display device of the present application, in the border area, the array substrate comprises a second common electrode trace, and the second common electrode trace is disposed on a side of the GOA circuit away from the display area; and the first common electrode trace is overlapped with the second common electrode trace.

In the display device of the present application, the border area further comprises a conductive paste fixedly disposed between the array substrate and the color filter substrate, the GOA circuit and the signal trace are electrically connected through the conductive paste, and the first common electrode trace and the second common electrode trace are electrically connected through the conductive paste.

In the display device of the present application, the array substrate comprises a first metal layer, a first insulating layer, an active layer, a second metal layer, a second insulating layer, a first planarization layer, and a first transparent conductive layer, which are sequentially disposed on the first substrate; wherein the color filter substrate comprises a third metal layer, a third insulating layer, a second planarization layer, and a second transparent conductive layer, which are sequentially disposed on the second substrate; and wherein the first transparent conductive layer and the second transparent conductive layer are electrically connected through the conductive paste.

Compared with the display panel of the prior art, the display panel and the display device of the present application reduce the width of the frame on the side of the array substrate by transferring the signal trace to the color filter substrate and overlapping with the GOA circuit. The common electrode traces in the array substrate of the conventional technology that need to be slit are also transferred to the color filter substrate of the present application, so that the first common electrode trace of the present application is disposed on the color filter substrate, and the first common electrode trace is the solid trace, which prevents the slit on the one hand, and on the other hand the first common electrode trace and the second common electrode trace overlap, which together save space, thereby solving the technical problem that the existing display panel has a greater requirement on the width of the border.

BRIEF DESCRIPTION OF DRAWINGS

In order to more clearly illustrate the embodiments of the present application or the technical solutions in the prior art, the drawings used in the embodiments will be briefly described below. The drawings in the following description are only partial embodiments of the present application, and those skilled in the art can obtain other drawings according to the drawings without any creative work.

DETAILED DESCRIPTION OF PREFERRED EMBODIMENTS

Figure 1:
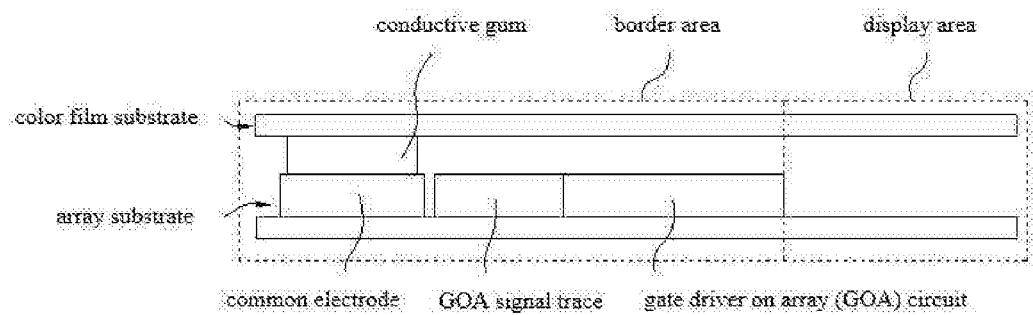
FIG. 1 is a schematic structural view of a display panel of the prior art.

Please refer to the drawings in the drawings, in which the same reference numerals represent the same components. The following description is based on the specific embodiments of the present application as illustrated, and should not be considered as limiting other specific embodiments not specifically described herein.

Figure 2:
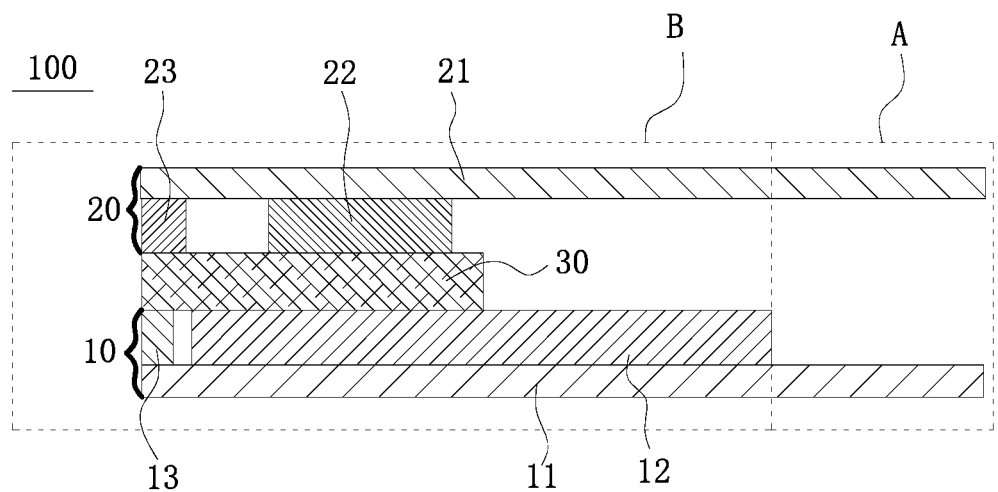
FIG. 2 is a schematic structural diagram of a display panel according to an embodiment of the present application.
Figure 3:
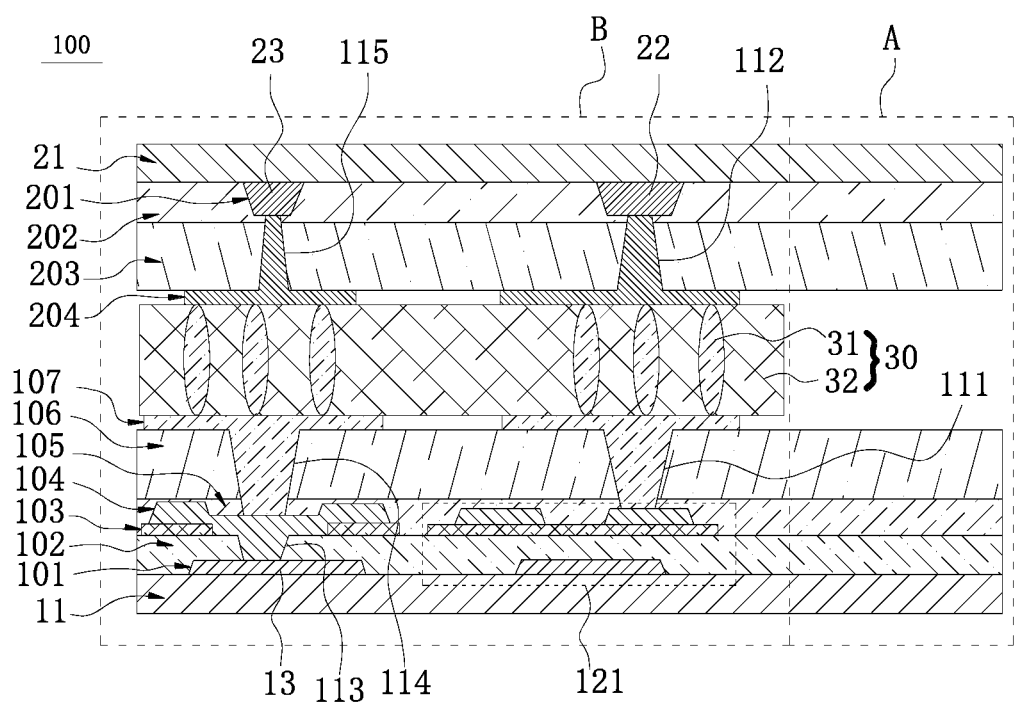
FIG. 3 is another schematic structural diagram of a display panel according to an embodiment of the present application.

Please refer to FIG. 2 and FIG. 3, FIG. 2 is a schematic structural diagram of a display panel according to an embodiment of the present application, FIG. 3 is another schematic structural diagram of a display panel according to an embodiment of the present application. The display panel 100 of the embodiment of the present application comprises a display area A and a border area B disposed at a periphery of the display area A.

The border area B comprises an array substrate 10, a color filter substrate 20, and a conductive paste 30 disposed between the array substrate 10 and the color filter substrate 20.

The array substrate 10 comprises a first substrate 11, and a gate driver on array (GOA) circuit 12 provided on the first substrate 11. The color filter substrate 20 comprises a second substrate 21 and a signal trace 22 disposed on the second substrate 21. The GOA circuit 12 is overlapped with the signal trace 22.

In a display panel of the prior art, the signal trace and the GOA circuit are disposed on the array substrate, so that the border side of the array substrate requires a large space. Meanwhile, the signal trace is located under the conductive paste, and in order to facilitate sufficient light curing of the conductive paste, the signal trace need to dig a slit, so that the light is irradiated to the conductive paste through the slit, thereby increasing the width of the signal trace, which increases the space requirement. However, the display panel 100 of the present embodiment transfers the signal trace 22 to the color filter substrate 20. On one hand, the signal trace 22 is overlapped with the GOA circuit 12, which reduces the width of the frame on which the signal trace 22 needs to be disposed on the array substrate 10 side; on the other hand, the signal trace 22 is located above the conductive paste 30, thereby preventing signal trace 22 from digging the slit, that is, the signal trace 22 is prepared in a solid manner, reducing the width of the signal trace 22, thereby reducing the space required for the signal trace 22, which saves the width of the border area B.

In the border area B of the display panel 100 of the present embodiment, the color filter substrate 20 comprises a first common electrode trace 23. The first common electrode trace 23 is disposed on the side of the signal trace 22 away from the display area A.

The array substrate 10 comprises a second common electrode trace 13. The second common electrode trace 13 is disposed on the side of the GOA circuit 12 remote from the display area A. The first common electrode trace 23 is overlapped with the second common electrode trace 13.

In the display panel of the prior art, a plurality of common electrode traces are disposed on the frame side of the array substrate, so that more space is needed for the array substrate side for arranging the common electrode traces, and the common electrode traces are located below the conductive paste. In order to facilitate the light curing of the conductive paste, the common electrode trace needs to dig a slit, so that the light is irradiated to the conductive paste through the slit, thereby increasing the width of the common electrode trace, which increases the space requirement. However, the display panel 100 of the present embodiment also transfers the first common electrode trace 23 requiring slits to the color filter substrate 20, such that the first common electrode trace 23 is disposed on the color filter substrate 20. On the one hand, the slit of the first common electrode trace 23 is prevented, that is, the first common electrode trace 23 is a solid trace, which saves space; on the other hand, the first common electrode trace 23 and the second common electrode trace 13 in an overlapping setting also saves space, thereby making the frame of the border area B narrower.

Specifically, the border area B of the display panel 100 of the present embodiment further comprises the conductive paste 30. The conductive paste 30 is fixedly disposed between the array substrate 10 and the color filter substrate 20. The GOA circuit 12 and the signal trace 22 are electrically connected through the conductive paste 30. The first common electrode trace 23 and the second common electrode trace 13 are electrically connected by the conductive paste 30.

The conductive paste 30 comprises a colloid 31 and an electrical conductor 32 disposed in the colloid 31. The GOA circuit 12 and the signal trace 22 are electrically connected by the electrical conductor 32. The first common electrode trace 23 and the second common electrode trace 13 are electrically connected through the electrical conductor 32. Optionally, the electrical conductor 32 is a gold ball.

In the display panel 100 of the present embodiment, the array substrate 10 comprises a first metal layer 101, a first insulating layer 102, an active layer 103, a second metal layer 104, a second insulating layer 105, a first planarization layer 106, and a first transparent conductive layer 107, which are sequentially disposed on the first substrate 11.

The color filter substrate 20 comprises a third metal layer 201, a third insulating layer 202, a second planarization layer 203, and a second transparent conductive layer 204, which are sequentially disposed on the second substrate 21.

The first transparent conductive layer 107 and the second transparent conductive layer 204 are electrically connected through the conductive paste 30. The first transparent conductive layer 107 and the second transparent conductive layer 204 are both indium tin oxide (ITO) layers.

Specifically, in the display panel 100 of the present embodiment, the GOA circuit 12 comprises a plurality of thin film transistors 121 (only one is shown as an example in the figure, but it is not limited thereto). Gate electrodes of the thin film transistors 121 are disposed in the first metal layer 101, that is, the first metal layer 101 comprises the gate electrodes of the thin film transistors 121; source electrodes and drain electrodes of the thin film transistors 121 are disposed in the second metal layer 104, that is, the second metal layer 104 comprises the source electrodes and drain electrodes of the thin film transistors 121; and channel regions of the thin film transistors 121 are disposed in the active layer 103, that is, the active layer 103 comprises the channel regions of the thin film transistors 121. The source electrodes and the drain electrodes are electrically connected to the first transparent conductive layer 107 through first vias 111.

The signal trace 22 is disposed in the third metal layer 201, that is, the third metal layer 201 comprises the signal trace 22. The signal trace 22 is electrically connected to the second transparent conductive layer 204 through a second via 112. The first transparent conductive layer 107 and the second transparent conductive layer 204 are electrically connected through the conductive paste 30, so that the signal trace 22 is electrically connected to the GOA circuit 12 to realize the transmission of the scan signal.

The second common electrode trace 13 is disposed in the first metal layer 101, that is, the first metal layer 101 comprises the second common electrode trace 13. The second common electrode trace 13 is electrically connected to the second metal layer 104 through a third via 113. The second metal layer 104 is electrically connected to the first transparent conductive layer 107 through a fourth via 114.

The first common electrode trace 23 is disposed in the third metal layer 201, that is, the third metal layer 201 comprises the first common electrode trace 23. The first common electrode trace 23 is electrically connected to the second transparent conductive layer 204 through a fifth via 115. The first transparent conductive layer 107 and the second transparent conductive layer 204 are electrically connected through the conductive paste 30. Therefore, the second common electrode trace 13 is electrically connected to the first common electrode trace 23 to realize transmission of the common electrode signal.

Compared with the display panel of the prior art, the display panel and the display device of the present application reduce the width of the frame on the side of the array substrate by transferring the signal trace to the color filter substrate and overlapping with the GOA circuit. The common electrode traces in the array substrate of the conventional technology that need to be slit are also transferred to the color filter substrate of the present application, so that the first common electrode trace of the present application is disposed on the color filter substrate, and the first common electrode trace is the solid trace, which prevents the slit on the one hand, and on the other hand the first common electrode trace and the second common electrode trace overlap, which together save space, thereby solving the problem that the existing display panel has a greater requirement on the width of the border.

In the above, various other changes and modifications can be made by those skilled in the art in accordance with the technical solutions and technical concept of the present application, and all such changes and modifications are subject to the scope of protection of the claims appended hereto.

What is claimed is:

1. A display panel, comprising a display area and a border area disposed at a periphery of the display area, the border area comprising:
    an array substrate comprising a first substrate and a gate driver on array (GOA) circuit disposed on the first substrate; and
    a color filter substrate comprising a second substrate and a signal trace disposed on the second substrate;
    wherein the GOA circuit is overlapped with the signal trace;
    wherein the color filter substrate comprises a first common electrode trace, and the first common electrode trace is disposed on a side of the signal trace away from the display area, the first common electrode trace is disposed only in the border area, and the first common electrode trace is used to transmit a common electrode signal for a common electrode;
    wherein in the border area, the array substrate comprises a second common electrode trace, and the second common electrode trace is disposed on a side of the GOA circuit away from the display area;
    wherein the first common electrode trace is overlapped with the second common electrode trace;
    wherein the first common electrode trace and the signal trace are solid metal traces;
    wherein the array substrate comprises a first metal layer, a first insulating layer, an active layer, a second metal layer, a second insulating layer, a first planarization layer, and a first transparent conductive layer, which are sequentially disposed on the first substrate;
    wherein the color filter substrate comprises a third metal layer, a third insulating layer, a second planarization layer, and a second transparent conductive layer, which are sequentially disposed on the second substrate; and
    wherein the first transparent conductive layer and the second transparent conductive layer are electrically connected through the conductive paste.

2. The display panel of claim 1, wherein the border area further comprises a conductive paste fixedly disposed between the array substrate and the color filter substrate, the GOA circuit and the signal trace are electrically connected through the conductive paste, and the first common electrode trace and the second common electrode trace are electrically connected through the conductive paste.

3. The display panel of claim 1, wherein the GOA circuit comprises a plurality of thin film transistors, gate electrodes of the thin film transistors are disposed in the first metal layer, source electrodes and drain electrodes of the thin film transistors are disposed in the second metal layer, channel regions of the thin film transistors are disposed in the active layer, and the source electrodes and the drain electrodes are electrically connected to the first transparent conductive layer through first vias, and
    wherein the signal trace is disposed in the third metal layer, and the signal trace is electrically connected to the second transparent conductive layer through a second via.

4. The display panel of claim 1, wherein the second common electrode trace is disposed in the first metal layer, the second common electrode trace is electrically connected to the second metal layer through a third via, and the second metal layer is electrically connected to the first transparent conductive layer through a fourth via; and
    wherein the first common electrode trace is disposed in the third metal layer, and the first common electrode trace is electrically connected to the second transparent conductive layer through a fifth via.

5. The display panel of claim 2, wherein the conductive paste comprises a colloid and an electrical conductor disposed in the colloid, the GOA circuit and the signal trace are electrically connected through the electrical conductor, and the first common electrode trace and the second common electrode trace are electrically connected through the electrical conductor.

6. A display device comprising a display panel, and the display panel comprising a display area and a border area disposed at a periphery of the display area, the border area comprising:
    an array substrate comprising a first substrate and a gate driver on array (GOA) circuit disposed on the first substrate; and
    a color filter substrate comprising a second substrate and a signal trace disposed on the second substrate;
    wherein the GOA circuit is overlapped with the signal trace;
    wherein the color filter substrate comprises a first common electrode trace, and the first common electrode trace is disposed on a side of the signal trace away from the display area, the first common electrode trace is disposed only in the border area, and the first common electrode trace is used to transmit a common electrode signal for a common electrode;
    wherein in the border area, the array substrate comprises a second common electrode trace, and the second common electrode trace is disposed on a side of the GOA circuit away from the display area;

wherein the first common electrode trace is overlapped with the second common electrode trace;

wherein the first common electrode trace and the signal trace are solid metal traces;

wherein the array substrate comprises a first metal layer, a first insulating layer, an active layer, a second metal layer, a second insulating layer, a first planarization layer, and a first transparent conductive layer, which are sequentially disposed on the first substrate;

wherein the color filter substrate comprises a third metal layer, a third insulating layer, a second planarization layer, and a second transparent conductive layer, which are sequentially disposed on the second substrate; and wherein the first transparent conductive layer and the second transparent conductive layer are electrically connected through the conductive paste.

7. The display device of claim 6, wherein the border area further comprises a conductive paste fixedly disposed between the array substrate and the color filter substrate, the GOA circuit and the signal trace are electrically connected through the conductive paste, and the first common electrode trace and the second common electrode trace are electrically connected through the conductive paste.

8. The display device of claim 6, wherein the array substrate comprises a first metal layer, a first insulating layer, an active layer, a second metal layer, a second insulating layer, a first planarization layer, and a first transparent conductive layer, which are sequentially disposed on the first substrate;

wherein the color filter substrate comprises a third metal layer, a third insulating layer, a second planarization layer, and a second transparent conductive layer, which are sequentially disposed on the second substrate; and wherein the first transparent conductive layer and the second transparent conductive layer are electrically connected through the conductive paste.

* * * * *